United States Patent [19]

Ando

[11] Patent Number: 5,254,885

[45] Date of Patent: Oct. 19, 1993

[54] BI-CMOS LOGIC CIRCUIT WITH FEEDBACK

[75] Inventor: Kouichi Ando, Tokyo, Japan

[73] Assignee: NEC Corporation, Tokyo, Japan

[21] Appl. No.: 818,094

[22] Filed: Jan. 8, 1992

[30] Foreign Application Priority Data

Jan. 8, 1991 [JP] Japan .................................. 3-000667
Feb. 7, 1991 [JP] Japan .................................. 3-016170

[51] Int. Cl.$^5$ .......................................... H03K 19/02
[52] U.S. Cl. .................................... 307/446; 307/570
[58] Field of Search ................................ 307/446, 570

[56] References Cited

U.S. PATENT DOCUMENTS

| | | | |
|---|---|---|---|
| 4,769,561 | 9/1988 | Iwamura et al. | 307/446 |
| 4,829,201 | 5/1989 | Masuda et al. | 307/446 |
| 4,977,337 | 12/1990 | Ohbayashi | 307/446 |
| 5,001,365 | 3/1991 | Murabayashi | 307/446 |

Primary Examiner—Edward P. Westin
Assistant Examiner—Andrew Sanders
Attorney, Agent, or Firm—Sughrue, Mion, Zinn, Macpeak & Seas

[57] ABSTRACT

A logic circuit includes a first and a second bipolar transistor forming a signal output circuit; first and a second MOS transistor circuits each for performing a specified logic operation with the input signal, and making or breaking connection between the collector and the base of the first and second bipolar transistors, respectively, in reverse relation to each other. A third MOS transistor circuit is connected between the first bipolar transistor and a ground potential point, and second MOS transistor is connected between the base and the emitter of the first MOS. A control circuit is provided for causing the first and second MOS transistors to turn ON or OFF later than the turn-ON of turn-OFF of the first and second MOS transistor circuits. Further, a third MOS transistor caused to turn ON or OFF by the control circuit is provided between the base of the first bipolar transistor and the third MOS transistor.

5 Claims, 11 Drawing Sheets

BI-CMOS LOGIC CIRCUIT WITH FEEDBACK

BACKGROUND OF THE INVENTION

1. Field of the Invention

This invention relates to a logic circuit and more particularly to a logic circuit suitable for the bipolar-CMOS (biCMOS) IC consisting of a CMOS transistor circuit for performing logic operation with input signals and a bipolar transistor circuit constructed as an output circuit for outputting the result of the operation.

2. Description of the Prior Art

Logic circuits of such type have combined advantage of low power dissipation involving the CMOS transistor circuit and large output current and high-speed operation involving the bipolar transistor circuit, and thus their use has become widespread.

Such a logic circuit comprises a first bipolar transistor for the signal output, of which the collector is connected to the first power supply terminal having a specified potential and the emitter is connected to the output terminal; a first MOS transistor circuit which consists of a p-(or n-)channel type MOS transistor, for making or breaking connection between the collector and the base of the first bipolar transistor in response of the result of a specified logic operation with the input signal; a second bipolar transistor for the signal output, of which the collector is connected to the output terminal and the emitter is connected to the second power supply terminal being at ground potential; and a second MOS transistor circuit, which consists of a n-(or p-)channel type MOS transistor, for making or breaking connection between the collector and the base of the second bipolar transistor in response of the result of a specified logic operation with input signals and in the reverse relation to the first bipolar transistor. The above output terminal is usually connected through a connection line to the next-stage circuit, and due to this connection line capacitance and the MOS transistor gate capacitances, the load circuit of this logic circuit is capacitive.

Once the first MOS transistor circuit is turned ON in response to the level change of the input signal, electric current flows to the base of the first bipolar transistor, the latter turning ON, and consequently the collector-emitter current which is several and tens times more than the base current flows. Under such conditions, the second MOS transistor circuit is turned OFF, which turns the second bipolar transistor OFF. Thus the load circuit is rapidly charged and its terminal voltage gets near the above-mentioned supply potential.

On the other hand when the first MOS transistor circuit turns OFF and the n-channel MOS transistor circuit turns ON, electric current flows to the base of the second bipolar transistor from the load circuit and thus the collector-emitter current of several and several tens times more than the base current flows to the second bipolar transistor, thereby the load circuit being rapidly discharged, and thus the terminal voltage get near ground potential.

The bipolar transistor however keeps ON-state, after the base current has been shut off, until completion of the base discharge. Once the first MOS transistor circuit turns ON, and in turn the load circuit begins to be charged. For a while after that, the second bipolar transistor is kept in ON state, and hence a part of current bypasses the load circuit by passing through the second bipolar transistor, resulting not only in longer time required for charging the load circuit but also in increased power consumption. Similarly bypass through the first bipolar transistor during charging the load circuit through the second bipolar transistor causes prolongation of the time required for the charging and increase of power consumption.

Accordingly there is provided in such kind of logic circuit a base-discharge circuit for each of the first and second bipolar transistors. Base-discharge circuits falls into two types of resistor circuit and MOS transistor circuit.

In the case of the resistor circuit type, a first resistor is connected between the base and the emitter of the first bipolar transistor and a second resistor between the second bipolar transistor of the base and emitter. These first and second resistors facilitate the discharge of the corresponding base of the bipolar transistors to make turn-OFF of the bipolar transistors faster, thereby increase in charging/discharging speed of the load circuit, and reduction of power consumption is attempted.

Fall in resistance value for hastening the base-discharge by this method however brings reduction of base current and slows turn-ON of bipolar transistor. Conversely increase in resistance value increases turn-ON speed and decreases turn-OFF. In summary it has been difficult to accelerate both turn-ON and turn-OFF.

On the other hand, in the latter case or with the base discharge circuit of the MOS transistor circuit type, a third MOS transistor circuit including n-(p-)channel type MOS transistor which turns ON or OFF in response to the result of logic operation with input signals is connected between the base of the first bipolar transistor and a ground potential point, and n-(or p-)channel type MOS transistor of which gate is connected to the output terminal and capable to turn ON or OFF in response to the signal level of the output terminal is connected between the base of the second bipolar transistor and a ground potential point. In this way, when the first MOS transistor circuit is turned OFF, which in turn shuts off the current to the base of the first bipolar transistor, then the third MOS transistor circuit is turned ON, and the base of the first bipolar transistor is discharged through the third MOS transistor circuit, which rapidly turns OFF the first bipolar transistor. Besides when the first MOS transistor circuit turns ON, the third MOS transistor circuit is turned OFF, and hence all the current through the first MOS transistor circuit is supplied to the base of the first bipolar transistor, and thus the first bipolar transistor is rapidly turned ON. Turn-ON and turn-OFF is in inverse relation between the first and third MOS transistor circuits. The electric currents flowing through MOS transistor circuits, respectively, decrease remarkably compared with in the former case with a resistor circuit type. The second bipolar transistor has similar relation to the second MOS transistor circuit and to the base-discharge MOS transistor, accordingly with higher effects of increasing speed and reducing power consumption than in the former case of the resistor circuit type.

The load circuit however is charged only with the emitter current of the first bipolar transistor, and hence the maximum effective voltage for charging the load circuit is lower by the base-emitter voltage of the first bipolar transistor. On the other hand, in the course of discharging the load circuit, its potential falls, and consequently the MOS transistor for discharging the base of the second bipolar transistor is turned OFF. Hence discharge thereafter is carried out only with emitter current of it. This implies that the minimum discharge potential of the load circuit is higher by the base-emitter voltage of the second bipolar transistor, correspondingly smaller amplitude of the output signal and lower noise margin results.

Besides the detailed investigation of the way that the first MOS transistor circuit and the third MOS transistor circuit are turned ON or OFF has revealed the following: between the MOS transistors which these MOS transistor circuits, respectively, consist of, there is difference in threshold voltage due to their different conductivity types. Also it takes some time for turning ON and OFF. Owing of these, their ON periods are overlapped as very short. Similar problem is encountered in the second MOS transistor circuit and the base-discharge MOS transistor. The latter approach cannot be said satisfactory and remains to be improved though it is of high-speed and low power consumption compared to the former.

BRIEF SUMMARY OF THE INVENTION

Object of the Invention

It therefore is the principal object of the present invention to provide a low power dissipation, high-speed logic circuit with an increased amplitude of the output signal and an improved noise margin.

Summary of the Invention

The first logic circuit according to the present invention comprises a signal outputting circuit consisting of a first bipolar transistor of which collector is connected to the first power supply terminal and the emitter to the output terminal, and a second bipolar transistor of which collector is connected to the output terminal and the emitter to the second power supply terminal; a first MOS transistor circuit of the one-conductivity type connected between the collector and the base of the first bipolar transistor, and serving as a bypass circuit in response to the result of a specified logic operation with the input signal; a second MOS transistor circuit of the opposite-conductivity type connected between the collector and the base of the second bipolar transistor, and serving as a bypass circuit in the reverse ON-OFF relation and complementary to the above-mentioned bypass circuit; a third MOS transistor circuit of the opposite-conductivity type connected between the base of the first bipolar transistor and the second power supply terminal, and capable of turning ON or OFF in the same relation to the above complementary bypass circuit in response to the result of a specified logic operation with the input signal; a base-discharge circuit consisting of a MOS transistor of the opposite-conductivity type connected between the base and the emitter of the second bipolar transistor, and caused to turn ON and OFF by a control circuit; and a further MOS transistor of the one-conductivity type connected between the base and the emitter of the first bipolar transistor, serving as a circuit for amplifying the output signal, and caused to turn ON or OFF by the control circuit.

The control circuit consists of an inverter by which a signal of the output terminal or the base of the first bipolar transistor is inverted in level and supplied to the bases of the above MOS transistors of the one- and opposite-conductivity type, respectively.

The MOS transistor of the one-conductivity type permits the maximum terminal voltage of the load circuit to reach supply potential, and the MOS transistor of the opposite-conductivity type permits the minimum terminal voltage of the load circuit to fall to ground potential.

The second logic circuit according to the present invention comprises first and second bipolar transistors as components of the above-mentioned signal outputting circuit; first and second MOS transistor circuits each for making or breaking connection between the collector and the base of respective bipolar transistor; a third MOS transistor circuit serving as a base-discharge circuit; an opposite-conductivity type MOS transistor; another opposite-conductivity type MOS transistor caused to turn ON or OFF by a control circuit and connected between the base of the first bipolar transistor and the third MOS transistor circuit. The control circuit consists of a first inverter by which the signal of the output terminal or the base of the first bipolar transistor is inverted in level and supplied to the gate of the opposite-conductivity MOS transistor serving as a base-discharge circuit, and a second inverter by which the output signal of the first inverter is inverted in level and supplied to the gate of the aforesaid opposite-conductivity type MOS transistor.

The opposite-conductivity type MOS transistor caused to turn ON or OFF by the above control circuit permits the third MOS transistor circuit which is ON, when the first MOS transistor circuit is ON, to disconnect from the base of the first bipolar transistor, and thus all electric current through the first MOS transistor circuit is supplied to the base of the first MOS transistor. This enables to realize low power dissipation and high-speed operation.

Combination of the above-described the first and second logic circuits according to the present invention may lead to achieving amplification of output signal, high speed operation, and low power dissipation.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
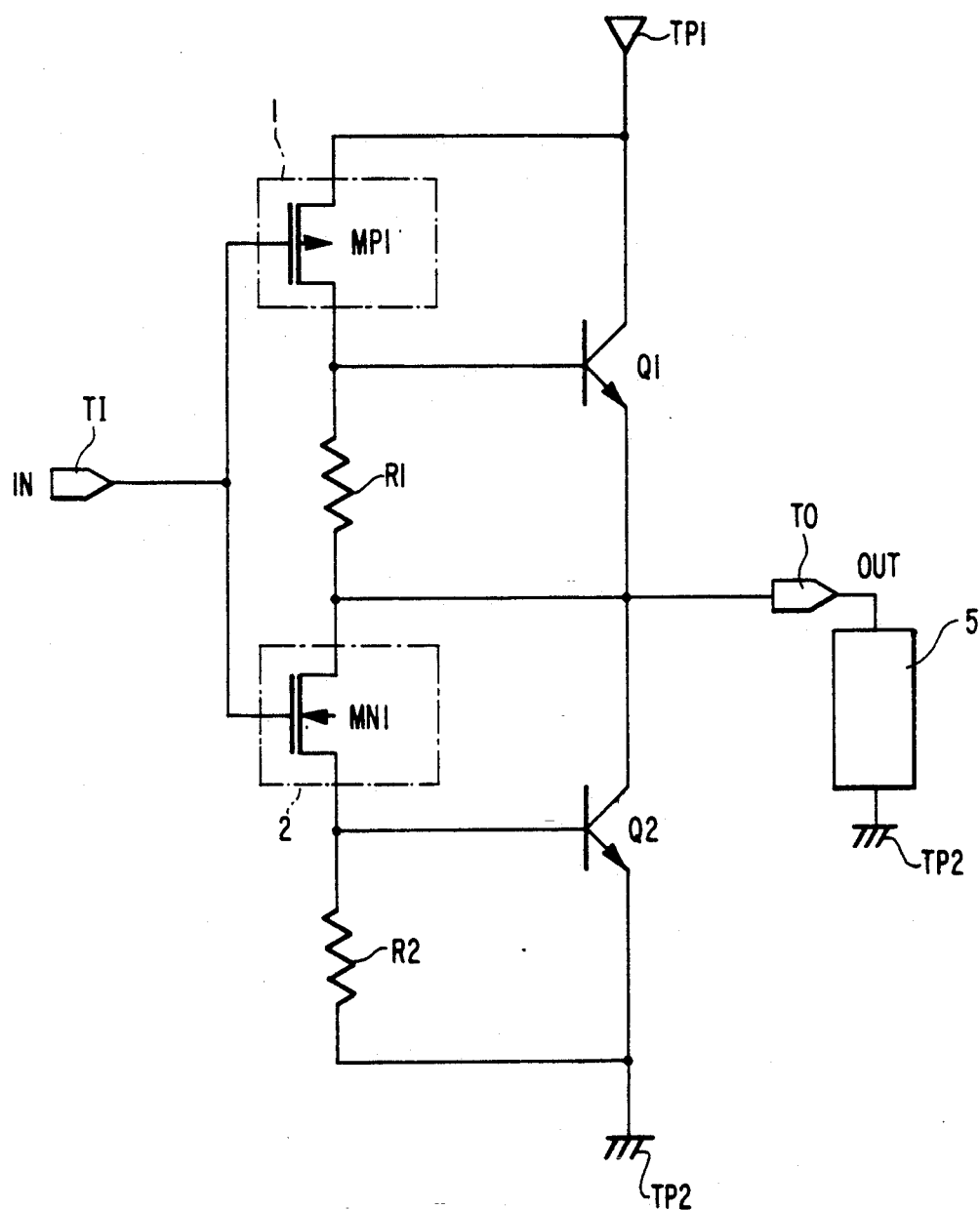
FIG. 1 is a circuit diagram of the first example of logic circuit in the prior art.

Reference is made to FIG. 1 which illustrates the first prior art example of logic circuit. This comprises a first non-type bipolar transistor Q1 of which the collector is connected to the first power supply terminal TP1 having a supply potential $V_{cc}$ and the emitter to the output terminal TO, and a second npn-type bipolar transistor Q2 of which the collector is connected to the output terminal TO and the emitter to the second power supply terminal TP2 being at ground potential (or a reference potential lower than $V_{cc}$). There is provided a first MOS transistor circuit 1 which is connected between the collector and the base of the first bipolar transistor Q1, and consists of a p-channel MOS transistor MP1 which makes or breaks connection between the collector and the base of the first bipolar transistor Q1 in response to the input signal IN from the input terminal TI. There is a second MOS transistor circuit 2 which is connected between the collector and the base of the second bipolar transistor Q2, and consists of a n-channel MOS transistor MN1 which makes or breaks connection between them in response of the input signal IN in the reverse relation to this collector-base. Besides there are provided first and second resistors R1 and R2 each between the base and the emitter of bipolar transistors Q1 and Q2, respectively, to construct their base-discharge circuits, respectively. Between output terminal TO and power supply terminal TP2, a capacitive load circuit 5 is connected.

The change of the input signal IN from High level to LOW causes p-channel MOS transistor MP1 of MOS transistor circuit 1 to turn ON, which allows electric current to be supplied to the base of bipolar transistor Q1. In response to this base current, the collector-emitter current magnitude of bipolar transistor Q1 increases to several and several tens times more than the base current to charge the load circuit 5 connected to output terminal TO. At the same time the aforesaid change of input signal IN turns OFF n-channel MOS transistor of MOS transistor circuit 2, which shuts off current to the base of bipolar transistor Q2. Then the base of bipolar transistor Q2 is discharged through resistor R2, which allows bipolar transistor Q2 to turn ON in a short time. As described above, in response to the change of input signal IN from HIGH level to LOW, transistor Q1 turns ON and Q2 turns off, and thus load circuit 5 is charged to a level near the power supply potential $V_{cc}$ for a short time.

The reverse change of input signal IN from LOW level to High causes p-channel MOS transistor MP1 to turn OFF, which shuts off electric current to the base of bipolar transistor Q1. Thereafter the base is discharged through the resistor R1, and thereby bipolar transistor Q1 is turned OFF rapidly to stop charging the load circuit 5. At the same time the aforesaid change of input signal IN turns ON n-channel MOS transistor MN1, which allows electric current to be supplied from load circuit 5 to the base of bipolar transistor Q2. In response to this base current, transistor Q2 turns ON, which allows load circuit 5 to be discharged as a large current flowing between the collector and emitter of it, and thus the terminal of load circuit 5, or the output signal OUT, rapidly reaches ground potential.

In this logic circuit construction, in the course of charging load circuit 5 the difference between its terminal voltage and supply voltage $V_{cc}$ becomes approximately equal to the base-emitter voltage of bipolar transistor Q1, which turns OFF bipolar transistor Q1, and thereafter load circuit 5 can be charged through transistor MP1 and resistor R1 until its terminal voltage reaches the maximum value, that is, supply potential $V_{cc}$.

Bipolar transistor Q2 turns OFF when the terminal voltage of load circuit 5 becomes mostly the same as its base-emitter voltage. Thereafter load circuit 5 can be discharged through transistor MN1 and resistor R2 until its terminal voltage reaches the minimum value, that is, ground potential. In this logic circuit construction, with decreasing values of resistors R1 and R2 for higher speed operation, time required for discharge of the base becomes smaller, and correspondingly times it takes for transistors Q1 and Q2 to turn OFF become shorter while times it takes to turn ON are longer because of increasing bypass currents through resistors R1 and R2, respectively. With increasing value of each resistor R1 and R2, times required for turning ON and OFF, respectively, becomes shorter and longer.

Figure 2:
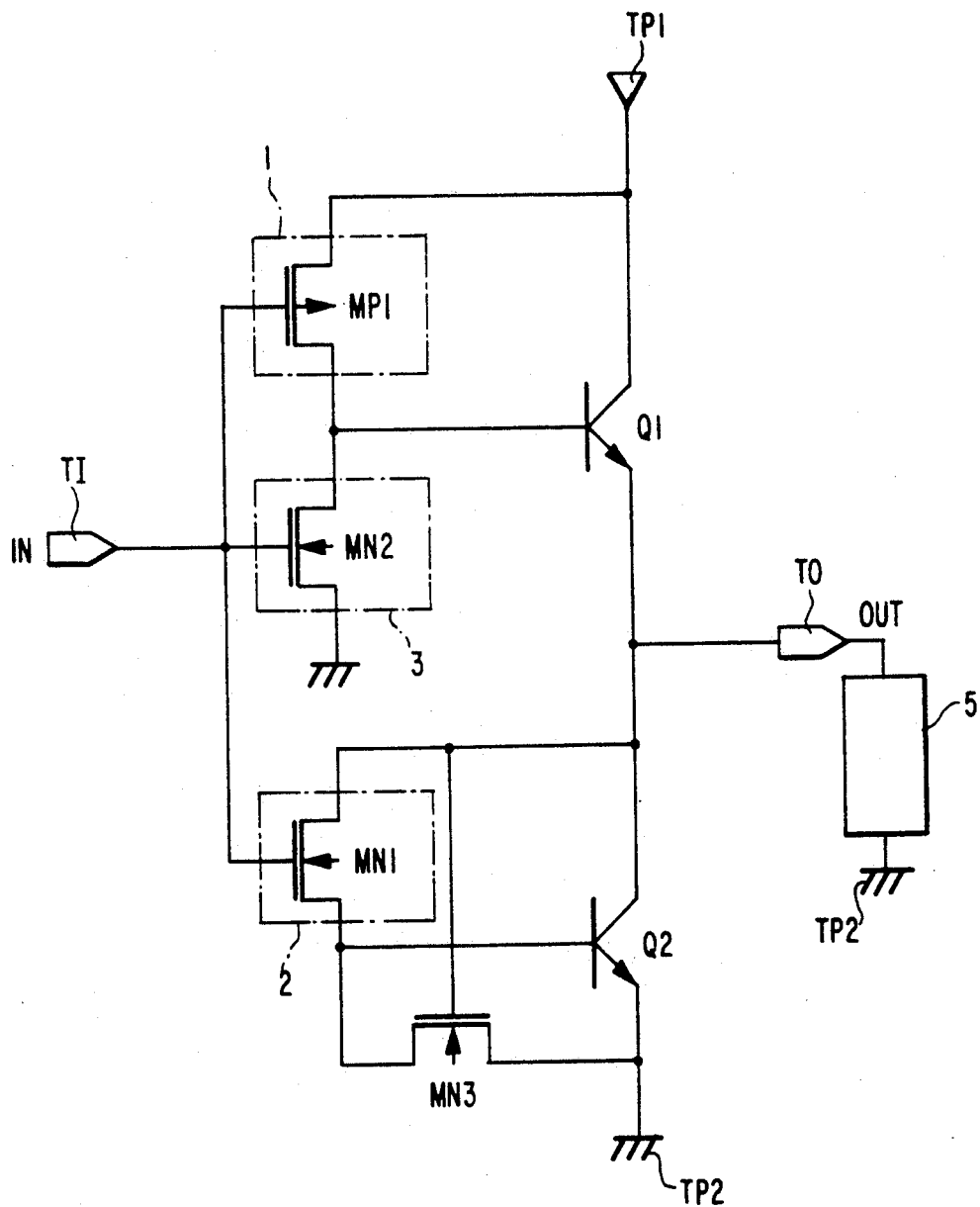
FIG. 2 is a circuit diagram of the second example of logic circuit in the prior art.

Referring to FIG. 2 in which another example of logic circuit in the prior art is diagrammed, it further comprises a third MOS transistor circuit 3 consisting of a n-channel MOS transistor MN2 which makes or breaks connection between the base of bipolar transistor Q1 and the second power supply terminal TP2 in response to input signal IN in the reverse relation to the collector-base of bipolar transistor Q1, and a n-channel MOS transistor MN3 which makes or breaks connection between the base and emitter of bipolar transistor Q2 in response to the level of the signal (OUT) of the out terminal TO. All except these base-discharge circuits are the same as in FIG. 1.

In this logic circuit construction, the change of input signal IN from High level to Low causes p-channel MOS transistor MP1 of MOS transistor circuit 1 to turn ON, and n-channel MOS transistor MN2 of MOS transistor circuit 3 to turn OFF, which allows all current passing through p-channel MOS transistor MP1 bipolar transistor Q1 serves as the base current of bipolar transistor Q1, and hence transistor Q1 is rapidly turned ON. At the same time, in response to the aforesaid change of input signal IN, n-channel MOS transistor MN1 of MOS transistor circuit 2 turns OFF to shut off electric current to the base of bipolar transistor Q2. At this time, n-channel MOS transistor MN3 is ON, and hence the base of bipolar transistor Q2 is discharged through this transistor MN3 to rapidly turn OFF this bipolar transistor. Thus load circuit 5 is charged rapidly to substantially supply potential $V_{cc}$.

Besides the change of input signal IN from LOW level to HIGH causes each circuit element to perform similar function in the reverse relation to the above-stated, with the result that the load circuit 5 is discharged quickly, and its terminal voltage falls to approximately ground potential.

In this logic circuit construction however the load circuit 5 can be charged only with the emitter current of bipolar transistor Q1, accompanied by the voltage fall between the base and the emitter of this transistor Q1, and thus the maximum terminal voltage value of the load circuit 5 after becoming charged is lower by the base-emitter voltage than supply potential $V_{cc}$. On the other hand, in the course of discharging the load circuit 5, its terminal voltage gets near ground potential, which turns OFF n-channel MOS transistor MN3. When it further falls to the same as the base-emitter voltage of bipolar transistor Q2, transistor Q2 is turned OFF, too, thereby the discharge of the load circuit 5 is ceased. Thus the lowest terminal voltage value of load circuit 5 is higher by the above-mentioned base-emitter voltage of transistor Q2 than ground potential. The amplitude of the output signal OUT is correspondingly smaller, and thus noise margin is smaller.

Figure 3:
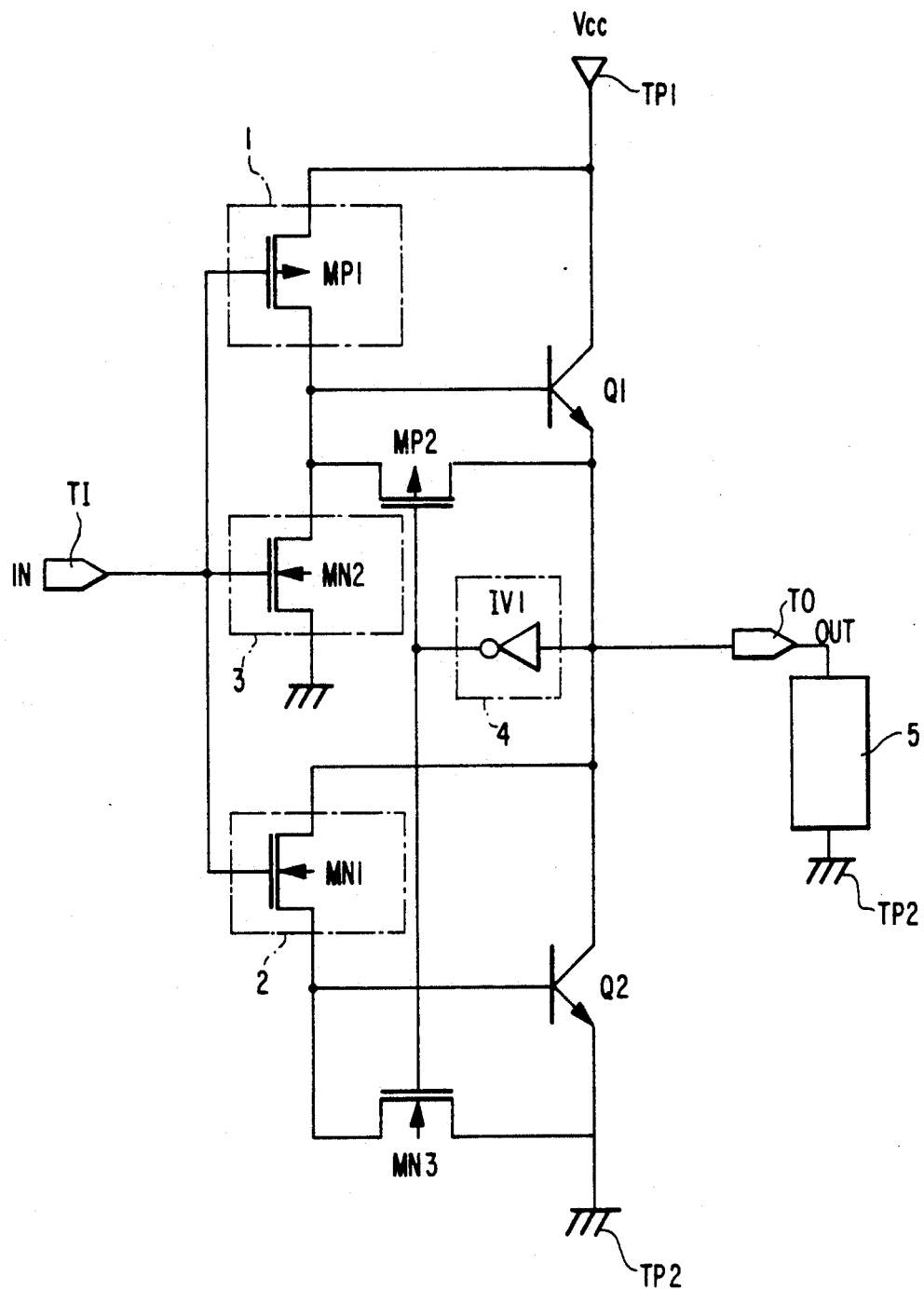
FIG. 3 is a circuit diagram of the first embodiment of logic circuit of the present invention.

Reference is made to FIG. 3 in which the first embodiment of logic circuit according to the present invention is diagrammed. It comprises, additionally to the circuit elements in the above-described logic circuit of FIG. 2, a p-channel MOS transistor MP2 connected between the base and the emitter of the first bipolar transistor Q1, and a control circuit 4 consisting of an inverter IV1 which inverts the level of the signal of output terminal TO and supplies it to the gate of transistor MP2 and also to the gate of n-channel MOS transistor MN3.

Control circuit 4 causes p-channel MOS transistor MP2 to be turned ON or OFF a specified time later than MOS transistor circuit 1 turns ON or OFF. Control circuit 4 causes n-channel MOS transistor MN3 to be turned ON or OFF a specified time later than MOS transistor circuit 2 turns ON or OFF, too. The change of input signal IN from HIGH level to LOW causes p-channel MOS transistor MP1 to be turned ON, which allows electric current to be supplied to the base of bipolar transistor Q1. At this time p-channel MOS transistor MP2 is OFF, by which hence bipolar transistor Q1 is unaffected over its base current, and hence turns OFF without delay. Additionally in response to the above-said change of input signal IN, n-channel MOS transistor MN1 turns OFF, which shuts off electric current to the base of bipolar transistor Q2. At this time n-channel MOS transistor MN3 is in ON state, through which the charge on the base of bipolar transistor Q2 is allowed to discharge, and hence bipolar transistor Q2 turns OFF without delay. Consequently load circuit 5 is rapidly charged and its terminal voltage reaches a level near the supply potential $V_{cc}$.

At this time bipolar transistor Q1 turns OFF but this charging continues until the terminal voltage of the load circuit 5 reaches supply potential $V_{cc}$, because p-channel MOS transistor MP2 receiving the level-inverted output of the terminal voltage of load circuit 5 through its output terminal TO turns ON in the course of the above-mentioned charging, and together with p-channel MOS transistor MP1 which is similarly ON, still allows load circuit 5 to be charged through them after bipolar transistor Q1 has turned OFF as mentioned above.

On the other hand, the change of input signal IN from LOW level to HIGH turns OFF p-channel MOS transistor MP1 to shut off electric current to the base of transistor Q1. The n-channel MOS transistor MN2 is turned ON and allows the base of bipolar transistor Q1 to be discharged through it, and thus bipolar transistor Q1 rapidly turns OFF. Additionally the aforesaid change of input signal IN turns ON n-channel MOS transistor MN1, all electric current through which flows to the base of bipolar transistor Q2 without being affected by the bypass circuit including transistor MN3 because the latter is in OFF state. Thus transistor Q2 is rapidly turned ON with the result of discharging load circuit 5 without delay.

When the terminal voltage of load circuit 5 discharges to a level near ground potential at which bipolar transistor Q2 turns OFF, but this discharging continues until the terminal voltage of the load circuit 5 reaches ground potential, because n-channel MOS transistor MN3 receiving the level-inverted output of the terminal signal OUT turns ON in the course of the above-mentioned charging of load circuit 5, and together with n-channel MOS transistors MN1 and MN3 which are similarly ON, still allows load circuit 5 to be discharged through them after bipolar transistor Q2 has turned OFF as mentioned above.

As described above, this logic circuit embodiment permits load circuit 5 to operate for its terminal voltage to reach $V_{cc}$ and ground potential, respectively, in response to those changes of input signal IN from LOW level to HIGH and vice versa, respectively. The output signal OUT of this logic circuit, namely, the amplitude of the terminal voltage of load circuit 5, therefore is increased compared with the output signal of the prior art circuit of FIG. 2, and its noise margin is correspondingly greater.

Figure 4:
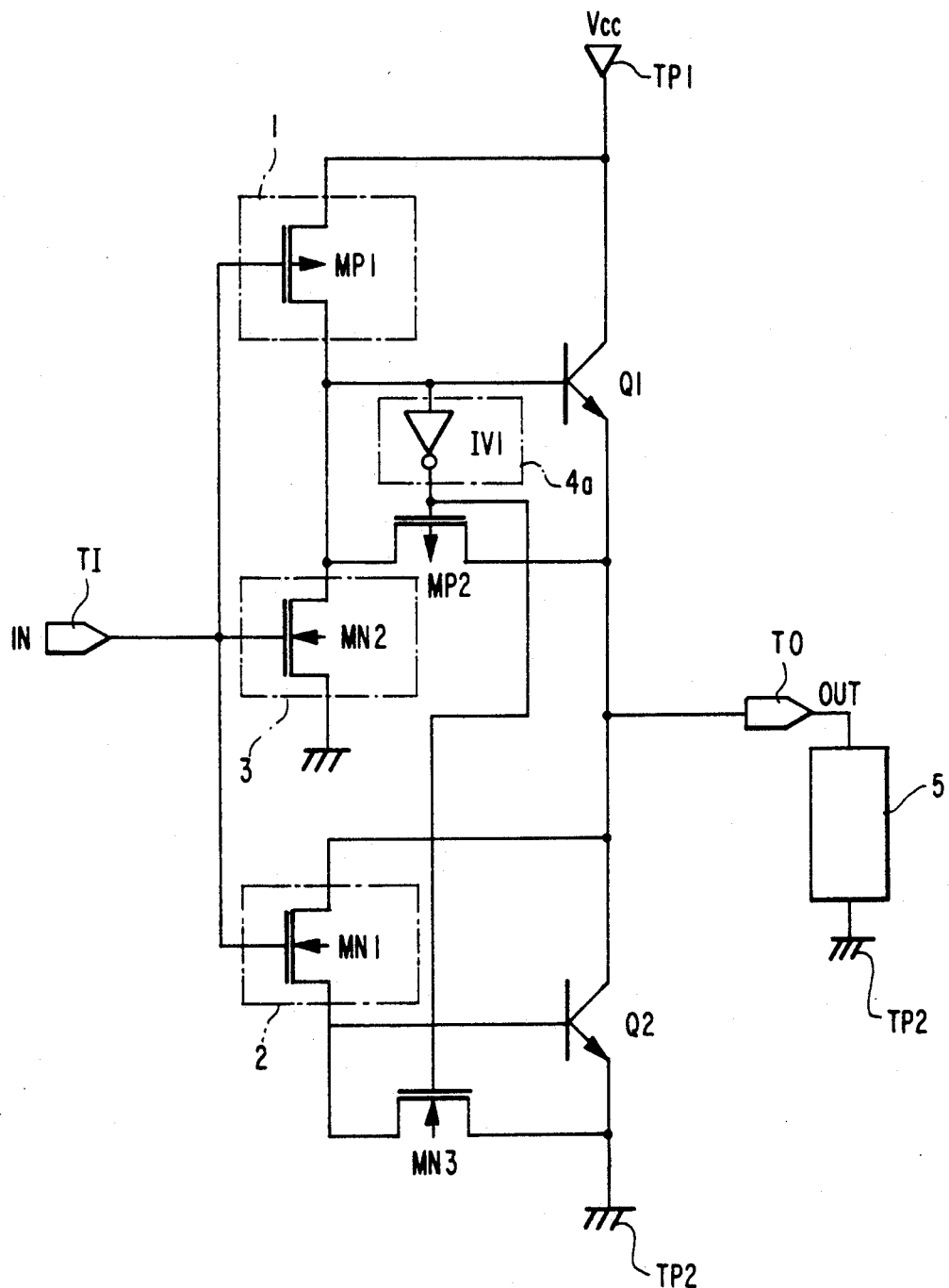
FIG. 4 is a circuit diagram of the second embodiment of logic circuit of the present invention.

In the above-described first embodiment the signal level of output terminal TO is inverted by the inverter IV1 of control circuit 4, and supplied to the gates of MOS transistors MP2 and MN3. It may be allowed, as the second embodiment shown FIG. 4, to invert the input to the base of bipolar transistor Q1, and supply this to these MOS transistors MP2 and MN3.

This embodiment is just the same in operation and advantage as the first embodiment except that is slightly different in timings of turn-ON and turn-OFF between MOS transistors MP2 and MN3, and therefore no further description of them is given.

Figure 5:
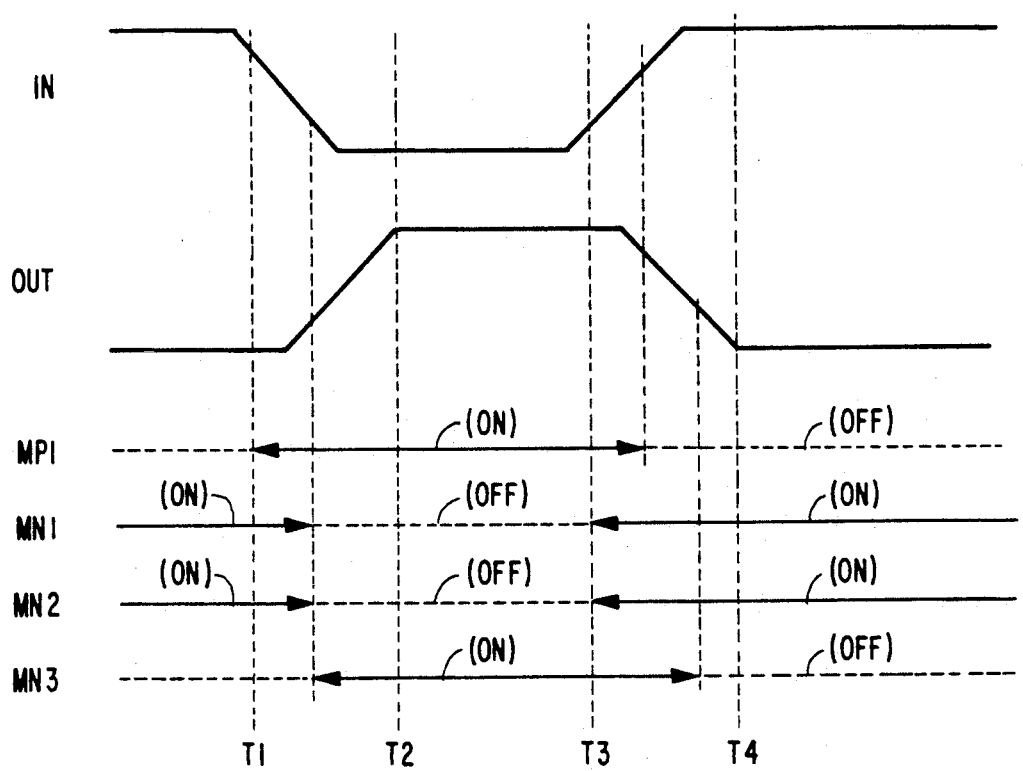
FIG. 5 is an operation-timing diagram for elements of the logic circuit of FIG. 2.

Before describing the advantages of the above-described embodiment, firstly, reference is made to FIG. 5 which shows the timing relation of turn-ON and turn-OFF between MOS transistors MP1 and MN2 in the prior art logic circuit diagrammed in FIG. 2, and that between MOS transistors MN1 and MN3. In response to the change of input signal IN from HIGH level to LOW, MOS transistor MP 1 turns ON. At this point of time T1, MOS transistor MN2 has not become OFF, and hence electric current is supplied through the turned-ON MOS transistor MP1 to the base of bipolar transistor Q1 which can be turned ON. A part of this current is bypassed through MOS transistor MN2 to the ground, and thereby bipolar transistor Q1 is turned ON with a delay. The cause of this is the difference in threshold voltage between these two MOS transistors MP1 and MN2. In response to the change of input signal IN from LOW level to HIGH, MOS transistor MN1 turns ON. At this time point T3, MOS transistor MN3 has not become OFF. Though all electric current passing through the turned-ON MOS transistor MN1 should be supplied to the base of bipolar transistor Q2 and useful for turning bipolar transistor Q2 ON, a part of it is, under this condition, bypassed through MOS transistor MN3 to ground potential, thereby turn-ON of bipolar transistor Q2 is delayed. This delay is attributed to difference between the gate input signals of MOS transistors MN1 and MN3.

The bypass currents through n-channel MOS transistors MN2 and MN3 not only delay turn-ON of bipolar transistors Q1 and Q2 but also increase total power dissipation of this logic circuit.

Figure 6:
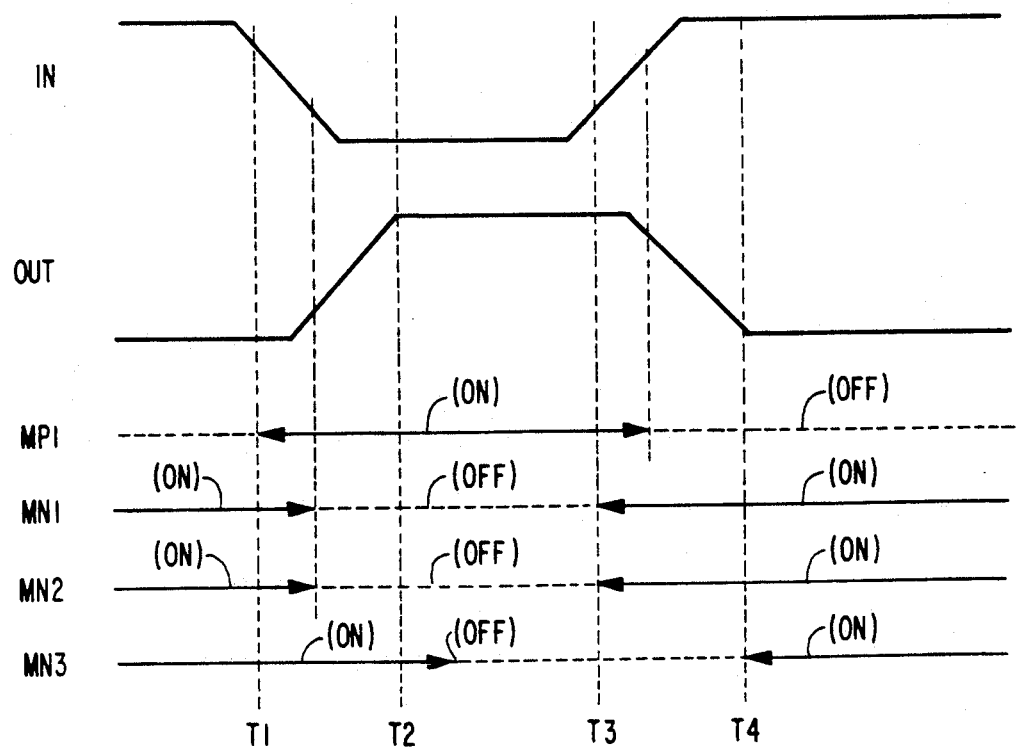
FIG. 6 is an operation-timing diagram for elements of the logic circuits of FIGS. 3 and 4.

On the other hand, reference is made to FIG. 6 which shows the timing relation of turn-ON and turn-OFF among MOS transistors MP1 and MN2 and MOS transistors MN1 and MN3 in the logic circuits of the above-described first and second embodiments. At the time T3

MOS transistor MN1 turns ON, MOS transistor MN3 is OFF, all electric current passing through transistor MN1 is supplied to the base of bipolar transistor Q2 which hence turns ON rapidly. As described above, to input the outputs of control circuit 4 (FIG. 3) or 4a (FIG. 4) to the gate of MOS transistor offers three advantages of amplification in low-level band of output signal OUT, high-speed operation, and low power dissipation.

Figure 7:
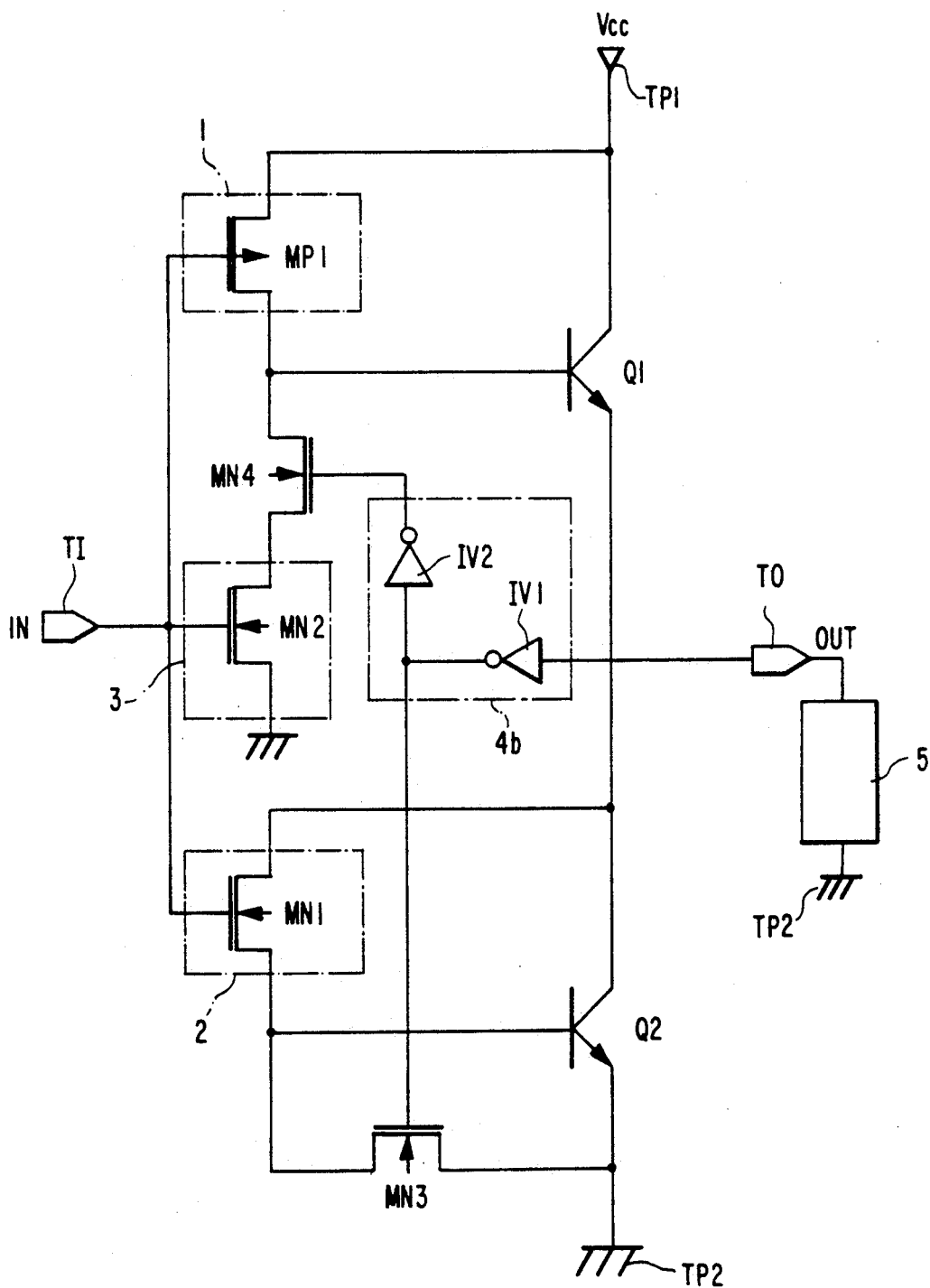
FIG. 7 is a circuit diagram of the third embodiment of the present invention.

Referring to FIG. 7 in which is diagrammed the third embodiment of the present invention, it comprises, instead of p-channel MOS transistor MP2 in the above-described second embodiment, a n-channel MOS transistor MN4 is connected between MOS transistor circuits 1 and 3, and instead of control circuit 4, a control circuit 4b consisting of two level-inverters IV1 and IV2 connected in series, the node between these inverters being connected to the gate of MOS transistor MN3, and the output signal of level-inverter IV2 to the gate of MOS transistor MN4. As apparent from this construction of control circuit 4b, this embodiment is the same as the prior art logic circuit diagrammed FIG. 2 except that the turn-ON and turn-OFF of MOS transistor MN3 which serves as a discharge circuit for the base of bipolar transistor Q2 are made with the output signal of inverter IV1, and a MOS transistor MN4 is used which responds to the output of control circuit 4b output from the other inverter IV2, and therefore these elements peculiar to this embodiment will be described below. The change of input signal IN from HIGH level to LOW turns ON MOS transistor MP1. At this time, because of out signal OUT having LOW level, MOS transistor MN4 remains OFF. Electric current passing through MOS transistor MP1 is all supplied to the base of bipolar transistor Q1 without bypassing through MOS transistor MN4 and control circuit 4b, and bipolar transistor Q1 is turned ON correspondingly rapidly. Besides no bypass current as mentioned above reflects low power dissipation. Once bipolar transistor Q1 is turned ON, output signal (OUT) level rises towards supply potential $V_{cc}$. In response to this rising level through the work of circuit 4b, MOS transistor MN4 turns ON, and constructs, together with MOS transistor circuit 3, a discharge circuit for the base of bipolar transistor Q1. Subsequently the change of input signal IN from LOW level to HIGH turns MOS transistor MP1 OFF and MN2 ON. At this time, MOS transistor MN4 remains ON, and hence the base of bipolar transistor Q1 is discharged through MOS transistors MN4 and MN2. On the other hand the operations of transistors MN1 and MN3, and bipolar transistor Q2 are the same as those of the logic circuit of FIG. 3, and their explanation is therefore omitted.

Figure 8:
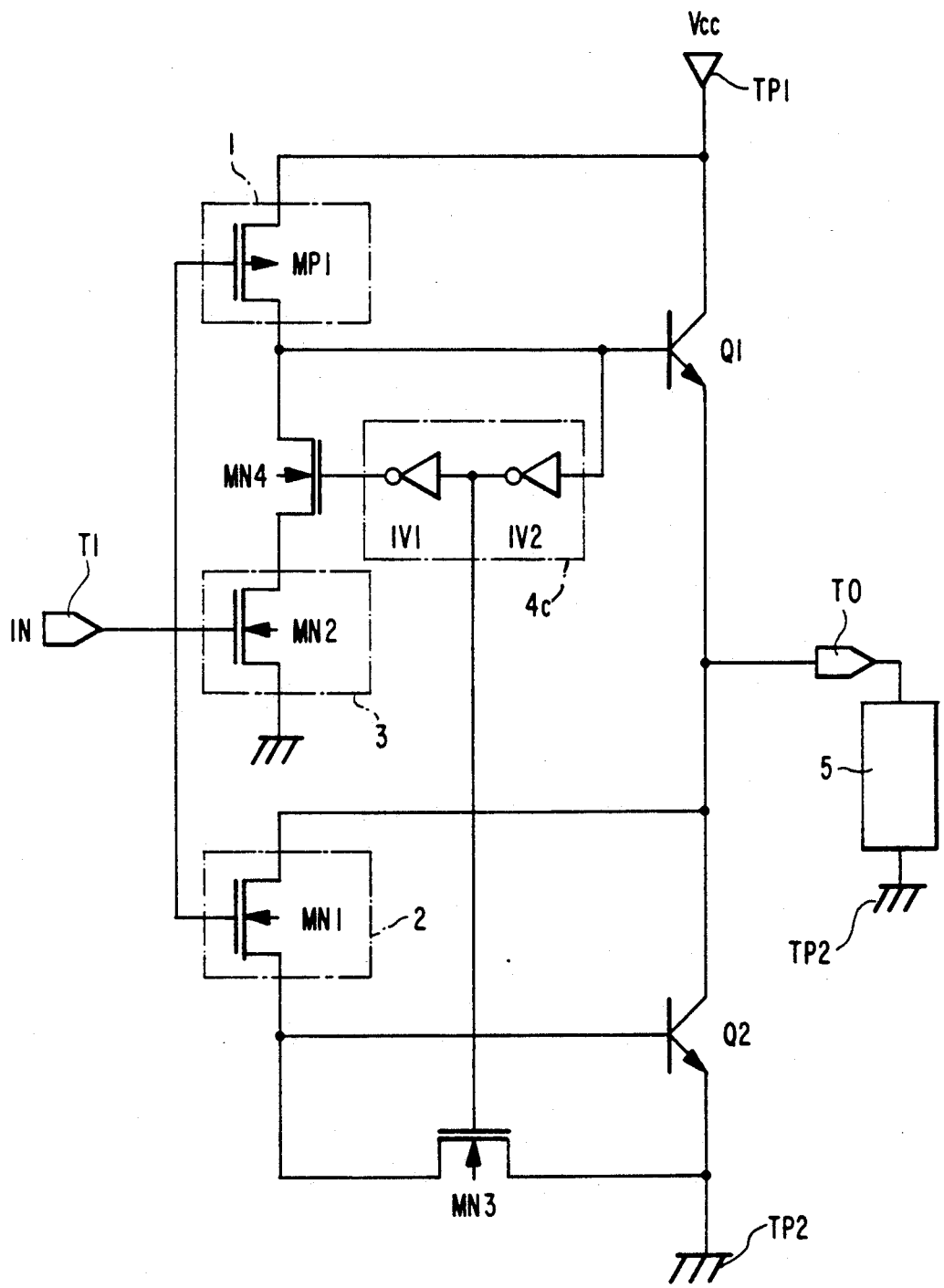
FIG. 8 is a circuit diagram of the fourth embodiment of the present invention.

The input of control circuit 4b in the above-described third embodiment may be connected, instead of to output terminal T0 as in this embodiment, to the base of bipolar transistor Q1 as control circuit 4c in the fourth embodiment of FIG. 8. This embodiment is all the same as the third embodiment described above except the respect that there is slight difference in the turn-ON and turn-OFF timings of MOS transistors MN3 and MN4 between them, and hence its detailed description is omitted.

Figure 9:
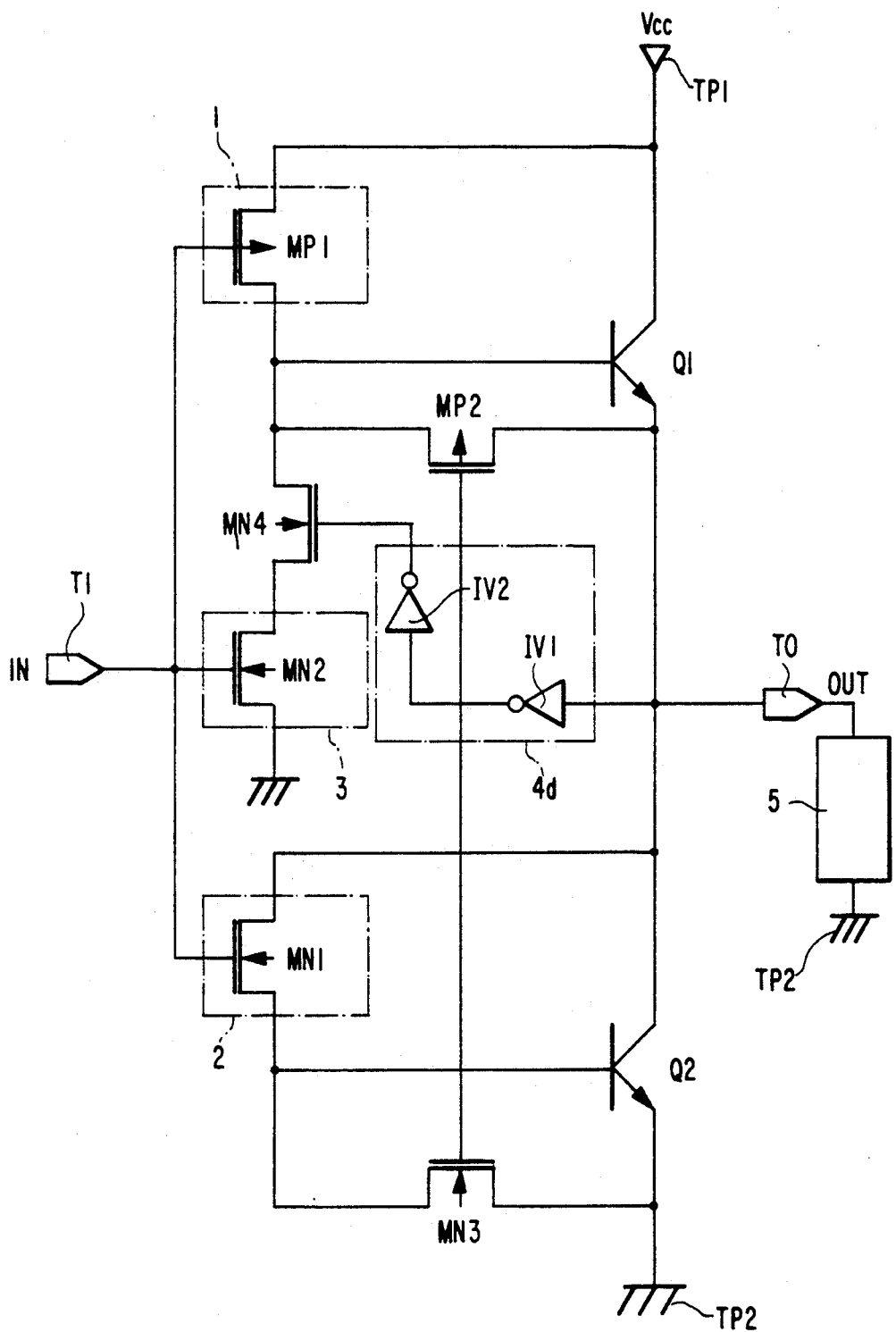
FIG. 9 is a circuit diagram of the fifth embodiment of the present invention.

Referring to FIG. 9, the fifth embodiment according to the present invention will be described, which has a construction that modifies the discharge circuit for the base of bipolar transistor Q1 in the third embodiment (FIG. 7) so that a transistor corresponding to MOS transistor MP2 in the first embodiment is additionally provided and its gate receives the output signal of the inverter IV1 of control circuit 4d.

Figure 10:
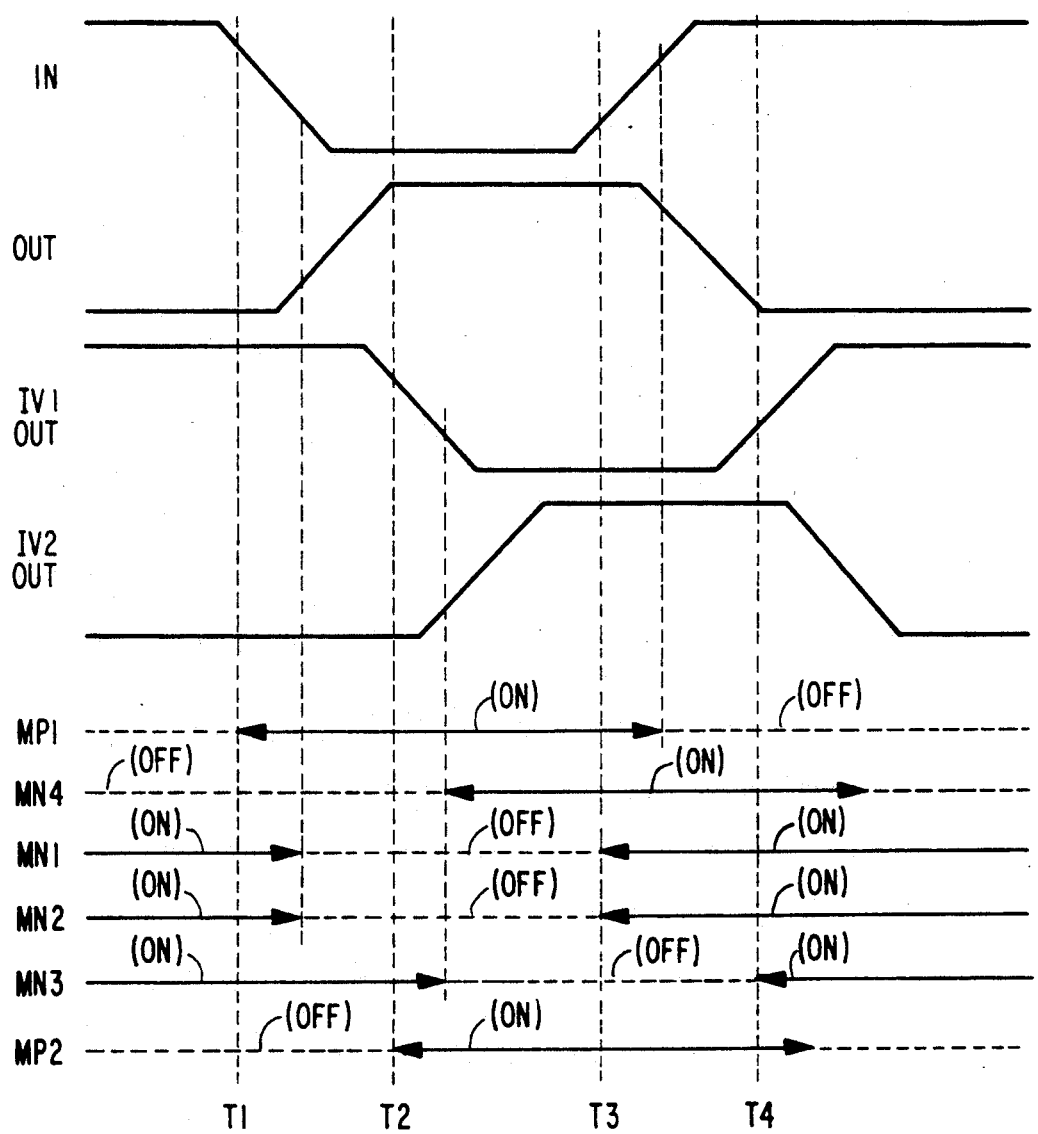
FIG. 10 is an operation-timing diagram for elements of the embodiment of FIG. 9.

Reference is made to FIG. 10 which shows timing relation of turn-ON and turn-OFF among elements of the above-described fifth embodiment: MOS transistors MP1, MN2 and MN1 through MN4. At the time T1 MOS transistor MP1 turns ON in response to the change of input signal IN from HIGH level to LOW, MOS transistors MP2 and MN4 are OFF, all electric current passing through MOS transistor MP1 is supplied, without bypassing through MP2 or MP4, to the base of bipolar transistor Q1 which accordingly is rapidly turned ON. On the other hand, in response to the above-mentioned change of input signal IN, MOS transistor MN1 turns OFF, which shuts off current to the base of bipolar transistor Q2. At this time point, MOS transistor MN3 is ON, and thus bipolar transistor Q2 turns OFF rapidly. Output signal OUT therefore changes rapidly load circuit 5 to cause its terminal voltage to gets near supply potential $V_{cc}$. When output signal OUT gets near supply potential $V_{cc}$, bipolar transistor Q1 turns OFF, and MOS transistor MP2 turns ON in response to the out signal of inverter IV1 while MOS transistors MN2 and MN4 remain OFF. Hence electric current flows through MOS transistor MP1 and the turned-ON MOS transistor MP2 to output terminal T0 until the value of output signal OUT reaches supply potential $V_{cc}$. Output signal OUT is supplied to the gate of MOS transistor MN4 with delay caused by inverters IV1 and IV2, which turns this transistor MN4 ON. Thus discharge of the base of bipolar transistor Q1 to be done at the next time point (T3) has been ready.

On the other hand the change of input signal IN from LOW level to HIGH turns OFF MOS transistor MP1, and concurrently turns ON MOS transistors MN1 and MN2. Besides MOS transistor MN3 is OFF, and hence all electric current passing through MOS transistor MN1 is supplied, without bypassing to the ground, to the base of bipolar transistor Q2 which is turned ON without delay. Thus load circuit 5 is rapidly discharged. The base of bipolar transistor Q1 is discharged through MOS transistors MN4 and MN2, and hence bipolar transistor Q1 is turned OFF without delay, too.

In the course of discharge of load circuit 5, once its terminal voltage falls near ground potential, bipolar transistor Q2 turns OFF while MOS transistor MN3 turns ON by the work of inverter IV1. Thus load circuit 5 continues to discharge through n-channel MOS transistors MN1 and MN3 until the terminal voltage of load circuit 5 reaches ground potential.

As described above, the fifth embodiment can achieve amplification of output signal OUT and reduction in power consumption.

Figure 11:
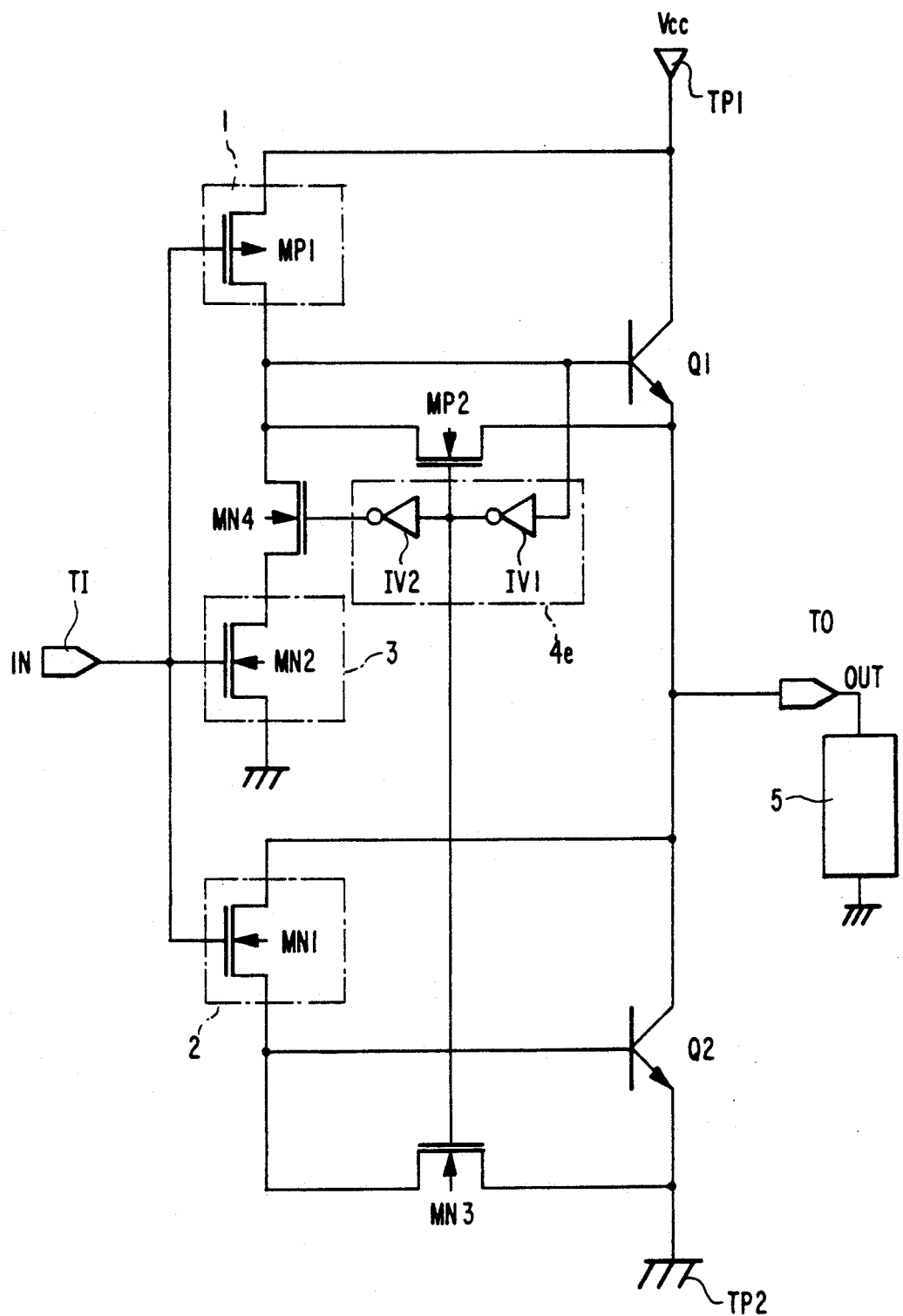
FIG. 11 is a circuit diagram of the sixth embodiment of the present invention.

The input of control circuit 4d in the above-described fifth embodiment may be connected, instead of to output terminal T0, to the base of bipolar transistor Q1 as in the fourth embodiment (FIG. 8). The sixth embodiment which is the so modified fifth embodiment as this is diagrammed in FIG. 11. Its operation and advantages are all the same as the fifth embodiment (FIG. 9), and its explanation therefore is omitted.

Figure 12:
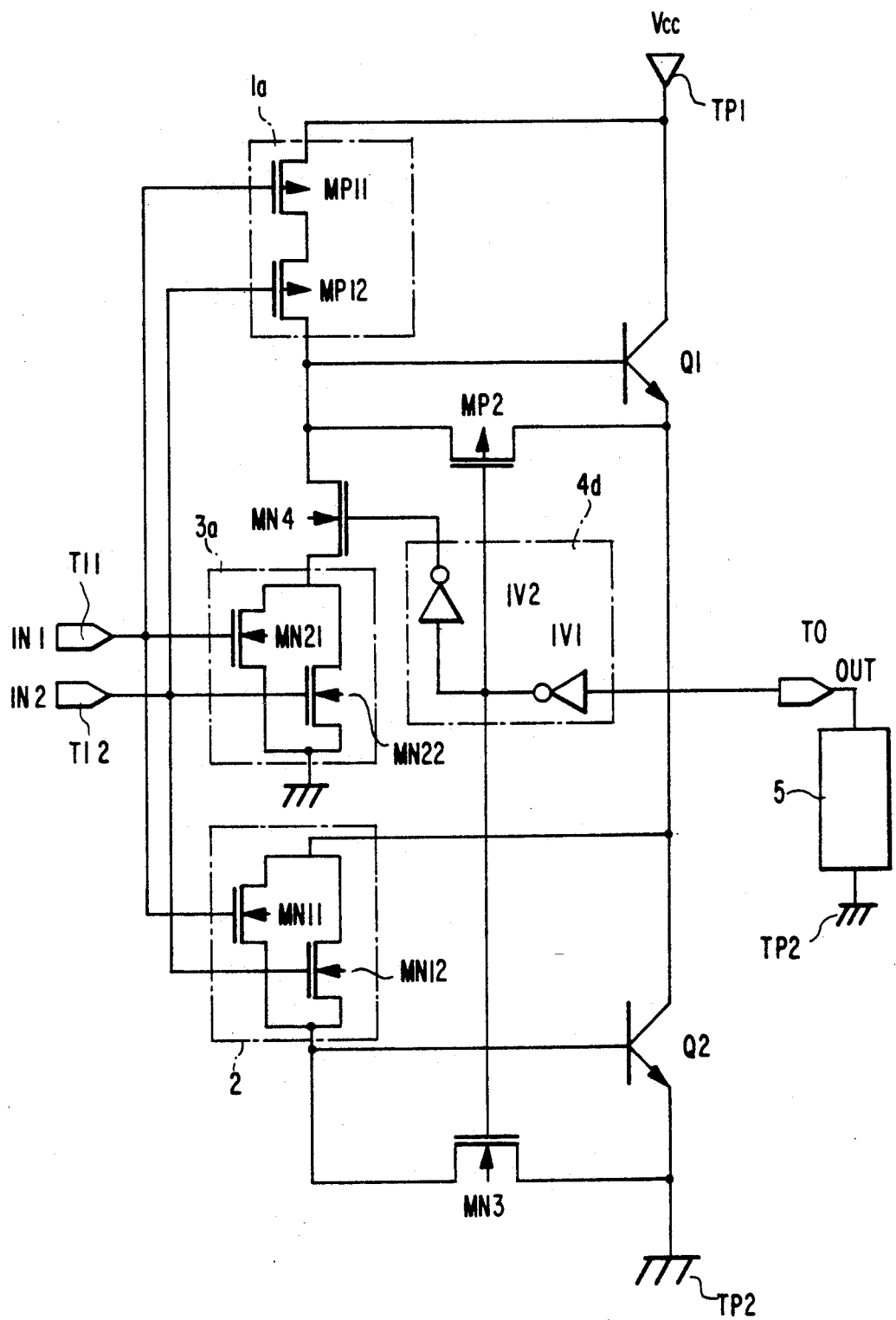
FIG. 12 is a circuit diagram of the seventh embodiment of the present invention.

Reference is made to FIG. 12 in which the seventh embodiment is diagrammed. While the first to sixth embodiments described above are of one-input NOT circuit type, this embodiment is of two-input NOR circuit type and comprises a pair of input terminals T11 and T12 into which a pair of binary inputs IN1/IN2 are input, and correspondingly three MOS transistor circuits 1a, 2a and 3a each consisting of a pair of MOS transistors MP11/MP12, MN11, MN12, and MN21, MN22, respectively, in place of MOS transistor circuits 1, 2 and 3. MOS transistor circuit 1a is constructed of p-channel MOS transistors MP11 and MP12 connected in series, their gates receiving input signals IN1 and IN2, respectively. MOS transistor circuit 2a is constructed of a pair of parallel connected n-channel MOS transistors MN11 and 12, and MOS transistor 3a are similarly constructed of a pair of parallel connected n-channel MOS transistors M N 2 1 and M N 2 2. As described above, the operation and functional advantages of the seventh embodiment, except the respect of performing logic operation by two-input NOR, is the same as those of the fifth embodiment (FIG. 9) which is of one-input NOT circuit type, and further description is omitted.

In the first to seventh embodiments described above, MOS transistors are used of two conductivity types: one is p-channel type and the other or opposite conductivity type is n-channel type, and bipolar transistors of npn type are used. It however may be self-evident to permit to select in other conductivity type. Logic circuits according to the present invention are not only of one-input NOT type or two-input NOR type but also may be of the form of multi-input NAND circuits.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A logic circuit comprising:
    a first bipolar transistor with a collector connected to a first power supply terminal and an emitter connected to an output terminal;
    a second bipolar transistor with a collector connected to said output terminal and an emitter connected to a second power supply corresponding to ground;
    a first MOS transistor circuit including a first MOS transistor of a first-conductivity type capable of turning ON/OFF in response to an input signal applied to a gate of said first MOS transistor, said first MOS transistor being connected between said collector and a base of said first bipolar transistor and operating as a first bypass between the collector and the base of said first bipolar transistor in response to a result of a specified logic operation in response to said input signal;
    a second MOS transistor circuit including a second MOS transistor of a second-conductivity type opposite to said first-conductivity type and capable of turning ON/OFF in response to said input signal applied to a gate of said second MOS transistor, said second MOS transistor being connected between said collector and a base of said second bipolar transistor and operating as a second bypass between said output terminal and said base of said second bipolar transistor in response to the result of said specified logic operation determined by said input signal, said second MOS transistor operating in reverse relation to said first MOS transistor;
    a third MOS transistor circuit including a third MOS transistor of said second-conductivity type capable of turning ON/OFF in response to said input signal applied to a gate of said third MOS transistor, said third MOS transistor providing a connection between the base of said first bipolar transistor and said second power supply terminal in response to the result of said specified logic operation in response said input signal, said third MOS transistor operating in the same relation to said second MOS transistor;
    a fourth MOS transistor of said first-conductivity type, a drain and a source of said fourth MOS transistor being connected to the base of said first bipolar transistor and to said output terminal, respectively;
    a fifth MOS transistor of said second-conductivity type, a source and a drain of said fifth MOS transistor being connected to said second power supply terminal and to the base of said second bipolar transistor, respectively; and
    a control circuit for causing said fourth MOS transistor to turn ON/OFF following a predetermined time interval beginning after the turn-ON/turn-OFF of said first MOS transistor circuit, and for causing said fifth MOS transistor to turn ON/OFF following a predetermined time interval beginning after the turn-ON/turn-OFF of said second MOS transistor circuit,
    wherein said control circuit includes an inverter supplied with a signal from the base of said first bipolar transistor, an inverted output supplied to the gates of said fourth and fifth MOS transistors, respectively.

2. A logic circuit comprising:
    a first bipolar transistor with a collector connected to a first power supply terminal and an emitter connected to an output terminal;
    a second bipolar transistor with a collector connected to said output terminal and an emitter connected to a second power supply terminal corresponding to ground;
    a first MOS transistor circuit including a first MOS transistor of a first-conductivity type capable of turning ON/OFF in response to an input signal applied to a gate of said first MOS transistor, said first MOS transistor being connected between said collector and a base of said first bipolar transistor and operating as a first bypass between the collector and the base of said first bipolar transistor in response to the result of a specified logic operation with said input signal;
    a second MOS transistor circuit including a second MOS transistor of a second-conductivity type opposite to said first-conductivity type and capable of turning ON/OFF in response to said input signal applied to a gate of said second MOS transistor, said second MOS transistor being connected between said collector and a base of said second bipolar transistor and operating as a second bypass between said output terminal and said base of said second bipolar transistor in response to the result of said specified logic operation with said input signal, said second MOS transistor operating in reverse relation to said first MOS transistor;
    a third MOS transistor of said second-conductivity type having a source and a drain path connected to the base of said first bipolar transistor;

a third MOS transistor circuit including a fourth MOS transistor of said second-conductivity type capable of turning ON/OFF in response to said input signal applied to a gate of said fourth MOS transistor, and operating between the source of said third MOS transistor and said second power supply terminal, said fourth MOS transistor forming a third bypass circuit similar to said second bypass circuit in response to the result of said specified logic operation with said input signal applied to a gate of said third MOS transistor;

a fifth MOS transistor of said second-conductivity type, having a drain and a source connected to the base of said second bipolar transistor and to said second power supply terminal, respectively; and a control circuit for causing said third MOS transistor to turn ON/OFF following a predetermined time interval beginning after the turn-ON/turn-OFF of said first MOS transistor circuit, and for causing said fifth MOS transistor to turn ON/OFF following a predetermined time interval beginning after the turn-ON/turn-OFF of said third MOS transistor circuit, wherein said control circuit includes a first inverter for inverting a signal at said base of said first bipolar transistor, said first inverter supplying an output to the gate of said fifth MOS transistor and a second inverter, the output signal of said first inverter being inverted by said second inverter and supplied to the gate of said third MOS transistor.

3. A logic circuit comprising:

a first bipolar transistor with a collector connected to a first power supply terminal and an emitter connected to an output terminal;

a second bipolar transistor with a collector connected to said output terminal and an emitter connected to a second power supply terminal corresponding to ground;

a first MOS transistor circuit including a first MOS transistor of a first-conductivity type capable of turning ON/OFF in response to an input signal applied to a gate of said first MOS transistor, said first MOS transistor being connected between said collector and a base of said first bipolar transistor and operating as a first bypass between the collector and the base of said first bipolar transistor in response to the result of a specified logic operation in response to said input signal;

a second MOS transistor circuit including a second MOS transistor of a second-conductivity type opposite to said first-conductivity type and capable of turning ON/OFF in response to said input signal applied to a gate of said second MOS transistor, said second MOS transistor being connected between said collector and a base of said second bipolar transistor and operating as a second bypass between said output terminal and said base of said second bipolar transistor in response to the result of said specified logic operation determined by said input signal, said second MOS transistor operating in reverse relation to said first MOS transistor;

a third MOS transistor of said second-conductivity type, a source and a drain path of said third MOS transistor being connected to the base of said first bipolar transistor;

a third MOS transistor circuit including a fourth MOS transistor of said second-conductivity type capable of turning ON or OFF in response to said input signal applied to a gate of said fourth MOS transistor, and operating between the source of said third MOS transistor and said second power supply terminal, said fourth MOS transistor forming a third bypass circuit similar to said second bypass circuit in response to the result of said specified logic operation in response to said input signal applied to a gate of said fourth MOS transistor;

a fifth MOS transistor of said second-conductivity type, having a drain and a source connected to the base of said second bipolar transistor and said second power supply terminal, respectively;

a sixth MOS transistor having a source and a drain connected to the base of the first bipolar transistor and to said output terminal, respectively, to turn ON/OFF following a specified time interval beginning after the turn-ON/turn-OFF of said first MOS transistor circuit; and a control circuit for causing said third MOS transistor to turn ON/OFF following a predetermined time interval beginning after the turn-ON/turn-OFF of said first MOS transistor circuit, and for causing said fifth MOS transistor to turn ON/OFF following a predetermined time interval beginning after the turn-ON/turn-OFF of said third MOS transistor circuit;

wherein said control circuit includes a first inverter inverting a signal from the base of said first bipolar transistor and supplying an inverted signal to the gates of said fifth and sixth MOS transistors, and a second inverter, said inverted signal output from said first inverter being further inverted by said second inverter and supplied to the gate of said third MOS transistor.

4. The logic circuit according to claims 1 through 3, wherein said input signal is composed of a single bit, and said first, second and third MOS transistor circuits each include one MOS transistor.

5. The logic circuit according to claims 1 through 3, wherein said input signal is composed of a plurality of parallel bits, and said first, second and third MOS transistor circuits each include a plurality of parallel MOS transistors receiving said parallel bits, respectively.

* * * * *